United States Patent
Kim

(10) Patent No.: US 10,825,712 B2
(45) Date of Patent: Nov. 3, 2020

(54) VACUUM CHUCK AND SEMICONDUCTOR MANUFACTURING APPARATUS HAVING THE SAME

(71) Applicant: SAMSUNG ELECTRONICS CO., LTD., Suwon-si, Gyeonggi-do (KR)

(72) Inventor: Young-min Kim, Asan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/151,485

(22) Filed: Oct. 4, 2018

(65) Prior Publication Data
US 2019/0252233 A1    Aug. 15, 2019

(30) Foreign Application Priority Data
Feb. 9, 2018 (KR) .................. 10-2018-0016569

(51) Int. Cl.
*H01L 21/683* (2006.01)
*H01L 21/67* (2006.01)
*H01L 21/68* (2006.01)
*H01L 21/00* (2006.01)
*B23B 31/30* (2006.01)

(52) U.S. Cl.
CPC .......... *H01L 21/6838* (2013.01); *H01L 21/00* (2013.01); *H01L 21/67265* (2013.01); *H01L 21/68* (2013.01); *B23B 31/307* (2013.01); *Y10T 279/11* (2015.01)

(58) Field of Classification Search
CPC .. B23B 31/307; H01L 21/6838; Y10T 279/11
See application file for complete search history.

(56) References Cited

U.S. PATENT DOCUMENTS

| 4,131,267 A | 12/1978 | Ono et al. |
| 4,597,228 A * | 7/1986 | Koyama ............... B24B 7/228 451/289 |
| 8,297,568 B2 | 10/2012 | Nakamura et al. |
| 9,233,455 B2 * | 1/2016 | Ooi .................. B25B 11/005 |
| 9,343,349 B2 * | 5/2016 | Iwashita ............ B23Q 3/088 |

(Continued)

FOREIGN PATENT DOCUMENTS

| JP | H05-253853 | 10/1993 |
| JP | 2008-132562 | 6/2008 |

(Continued)

OTHER PUBLICATIONS

Machine Translation, KR101425534, Park et al., Aug. 6, 2014. (Year: 2014).*

*Primary Examiner* — Eric A. Gates
*Assistant Examiner* — Chwen-Wei Su
(74) *Attorney, Agent, or Firm* — F. Chau & Associates, LLC

(57) ABSTRACT

A vacuum chuck includes an adsorption plate including porous materials, a housing including an accommodation part, a plurality of adsorption grooves, and a vacuum opening formed in the accommodation part. The adsorption plate is disposed in the accommodation part, and the plurality of adsorption grooves each have an arc shape and is formed in a surface of the accommodation part. The vacuum chuck further includes a vacuum line configured to supply vacuum pressure to the vacuum opening.

10 Claims, 8 Drawing Sheets

(56) References Cited

U.S. PATENT DOCUMENTS

2003/0181150 A1    9/2003    Arai et al.
2018/0065187 A1*    3/2018    Yamamoto ............ B23B 31/307
2018/0286772 A1*    10/2018    Yamamoto .......... H01L 21/6838

FOREIGN PATENT DOCUMENTS

| | | |
|---|---|---|
| JP | 2009-117567 | 5/2009 |
| JP | 2009-129944 | 6/2009 |
| JP | 4570054 | 8/2010 |
| KR | 10-2001-0107234 | 12/2001 |
| KR | 20120069391 A  * | 6/2012 |
| KR | 10-1425534 | 7/2014 |

* cited by examiner

VACUUM CHUCK AND SEMICONDUCTOR MANUFACTURING APPARATUS HAVING THE SAME

CROSS-REFERENCE TO RELATED APPLICATION

This application claims priority under 35 U.S.C. § 119 to Korean Patent Application No. 10-2018-0016569, filed on Feb. 9, 2018, in the Korean Intellectual Property Office, the disclosure of which is incorporated by reference herein in its entirety.

TECHNICAL FIELD

The present inventive concept relates to a vacuum chuck and a semiconductor manufacturing apparatus having the vacuum chuck, and more particularly, to a vacuum chuck for setting a location of a wafer, and a semiconductor manufacturing apparatus having the vacuum chuck.

DISCUSSION OF THE RELATED ART

Stably providing a wafer on a vacuum chuck of a semiconductor manufacturing apparatus is a significant factor for efficiency of a semiconductor manufacturing process and reliability of a semiconductor product. If the wafer is not stably provided on the vacuum chuck and the wafer is not properly positioned on the vacuum chuck, defects may occur such that reliability of the semiconductor product may be lowered and manufacturing time may be delayed.

SUMMARY

According to an exemplary embodiment of the present inventive concept, a vacuum chuck includes an adsorption plate including porous materials, a housing including an accommodation part, a plurality of adsorption grooves, and a vacuum opening formed in the accommodation part. The adsorption plate is disposed in the accommodation part, and the plurality of adsorption grooves each have an arc shape and is formed in a surface of the accommodation part. The vacuum chuck further includes a vacuum line configured to supply vacuum pressure to the vacuum opening.

According to an exemplary embodiment of the present inventive concept, a vacuum chuck includes a housing including an accommodation part having a first radius and a first depth, and a surface region surrounding the accommodation part and having a second radius that is greater than the first radius. The vacuum chuck further includes a plurality of adsorption grooves each having an arc shape and formed in the outside region, and an adsorption plate seated on the accommodation part and having a disc shape with a first thickness and a third radius that is substantially the same as the first radius.

According to an exemplary embodiment of the present inventive concept, a semiconductor manufacturing apparatus includes a vacuum chuck configured to set a location of a wafer, a pump configured to supply vacuum pressure to the vacuum chuck, and a power unit configured to supply a rotational force to the vacuum chuck. The vacuum chuck includes a non-conductive housing including an accommodation part and a region surrounding the accommodation part, a plurality of adsorption grooves each having an arc shape and formed in the region. The vacuum chuck further includes a non-conductive adsorption plate disposed in the accommodation part, including porous materials and having a disc shape.

According to an exemplary embodiment of the present inventive concept, a vacuum chuck includes a housing including an accommodation part provided in a central region of a first surface of the housing, a plurality of adsorption grooves surrounding the accommodation part and connected to the accommodation part, a vacuum opening formed in the accommodation part, and a vacuum line connected to the vacuum opening. The vacuum chuck further includes an adsorption plate including a porous material and overlapping the vacuum opening and connected to the plurality of adsorption grooves.

BRIEF DESCRIPTION OF THE DRAWINGS

The above and other features of the inventive concept will be more clearly understood by describing in detail exemplary embodiments thereof with reference to the accompanying drawings in which.

DETAILED DESCRIPTION OF THE EMBODIMENTS

Figure 1:
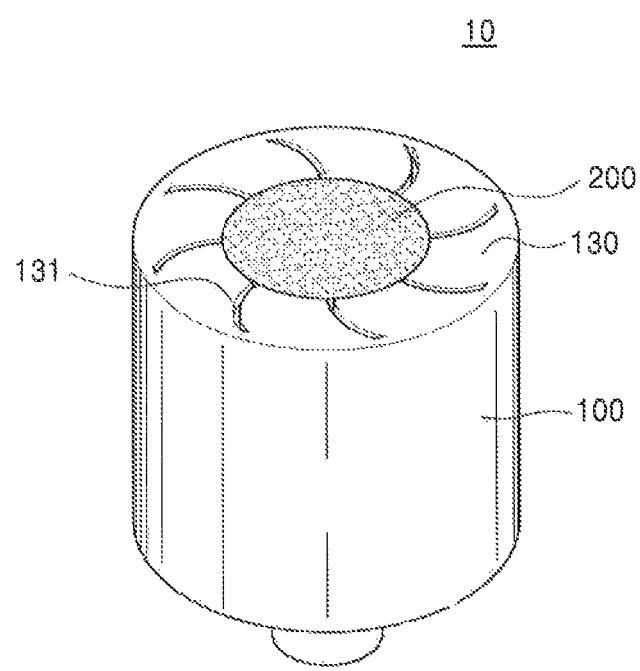
FIG. 1 is a perspective view of a vacuum chuck according to an exemplary embodiment of the present inventive concept.

Exemplary embodiments of the present inventive concept will be described more fully with reference to the accompanying drawings, in which exemplary embodiments of the inventive concept are shown. In the drawings, like numerals may refer to like elements.

Figure 2:
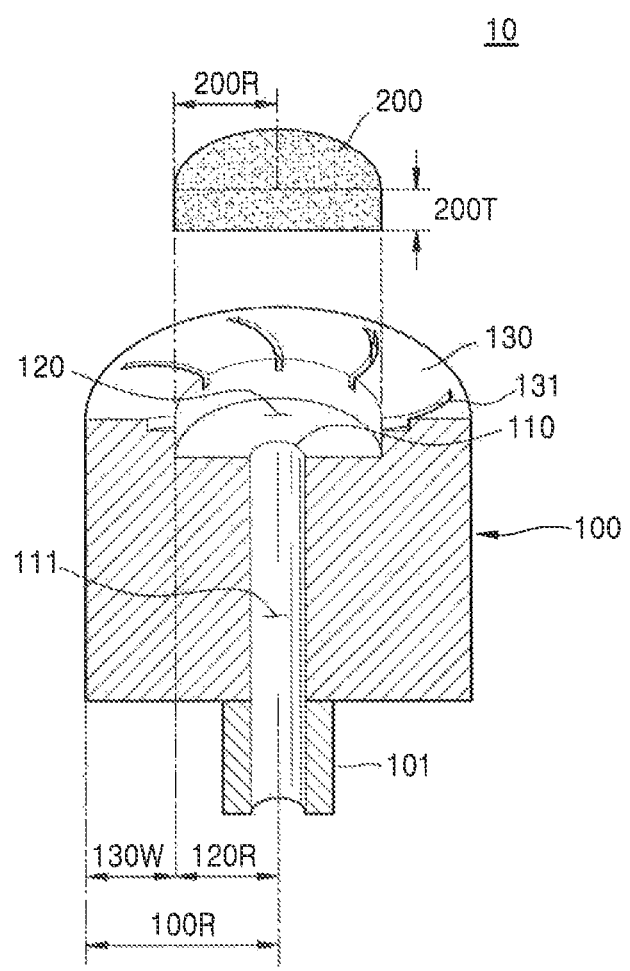
FIG. 2 is an exploded perspective view of a vacuum chuck according to an exemplary embodiment of the present inventive concept.

FIG. 1 is a perspective view of a vacuum chuck according to an exemplary embodiment of the present inventive concept, and FIG. 2 is an exploded perspective view of a vacuum chuck according to an exemplary embodiment of the present inventive concept.

Referring to FIGS. 1 and 2, a vacuum chuck 10 for setting a location of a wafer according to an exemplary embodiment of the present inventive concept includes a housing 100 and an adsorption plate 200.

The housing 100 has a cylindrical shape and includes a vacuum line 111. The vacuum line 111 is in the center or a central region of the housing 100 and extends from a bottom surface to a top surface of the housing 100 to provide vacuum pressure. In addition, an accommodation part 120 having a vacuum opening 110 connected to the vacuum line 111 may be formed in the center or a central region of the housing 100. The accommodation part 120 may be a cylindrical shaped opening or indentation in which the vacuum opening 110 is located in the center thereof. For example, the accommodation part 120 may be an opening or indentation in a surface of the housing 100.

A plurality of adsorption grooves 131 each having an arc shape are provided in an outside region 130 that surrounds the accommodation part 120 formed in the center of the housing 100. For example, the plurality of adsorption grooves 131 may extend in a radial direction. One end of each adsorption groove of the plurality of adsorption grooves 131 may extend to the accommodation part 120 and be connected thereto, and the other end of the plurality of adsorption grooves 131 may be placed in a radial form not to be in contact with edges of the housing 100. In other words, the accommodation part 120 and the plurality of adsorption grooves 131 may receive vacuum pressure from the vacuum line 111 connected to the vacuum opening 110.

In an exemplary embodiment of the present inventive concept, the adsorption grooves 131 may be straight and may have a width that narrows as the adsorption grooves 131 approach the edges of the housing 100. For example, a width of each of the adsorption grooves 131 nearest the adsorption plate 200 is greater than a width of each of the adsorption grooves 131 nearest the edges of the housing 100.

A radius 100R of the housing 100 may be designed to be approximately 1.5 to approximately 2 times a radius 120R of the accommodation part 120. In addition, a difference between the radius 100R of the housing 100 and the radius 120R of the accommodation part 120 may be equal to or greater than approximately 10 mm. In other words, a width 130W of the outside region 130 of the housing 100 may be equal to or greater than approximately 10 mm. For example, the width 130W of the outside region 130 may be substantially the same as a radius 200R of the adsorption plate 200. The radius 120R of the accommodation part 120 may be substantially the same as the radius 200R of the adsorption plate 200 such that the adsorption plate 200 may be provided in the accommodation part 120.

Figure 10:
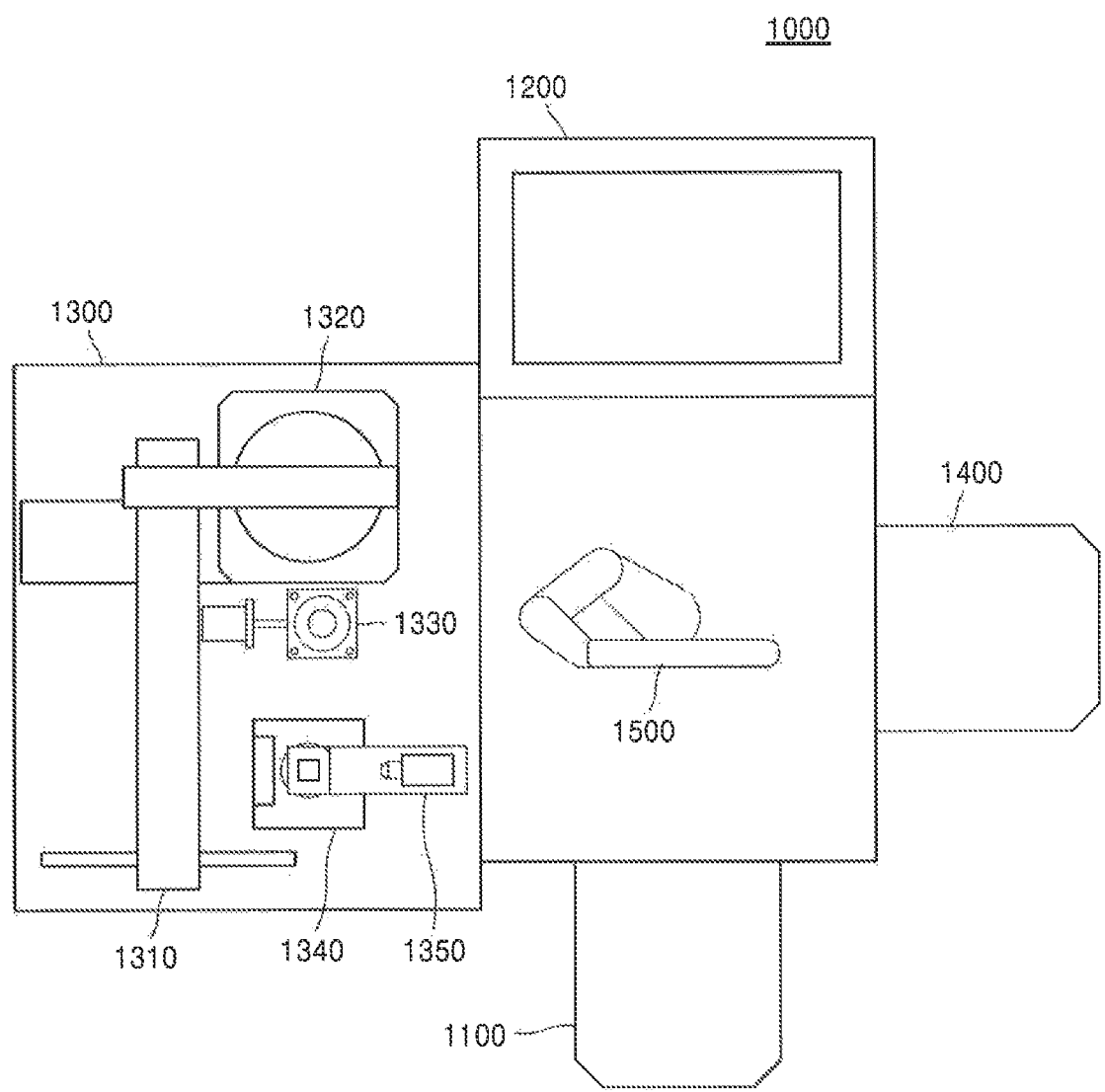
FIG. 10 is an internal plan view of a semiconductor manufacturing apparatus having a vacuum chuck according to an exemplary embodiment of the present inventive concept.

The adsorption plate 200 made of porous ceramic materials may be seated on an upper portion of the housing 100 and is coupled to a semiconductor manufacturing apparatus (see, e.g., 1000 of FIG. 10). The housing 100 may be made of the same materials as or similar materials to materials used to form the adsorption plate 200. To prevent leakage of vacuum pressure generated due to deformation caused by a difference in coefficients of thermal expansion (CTE) between the housing 100 and the adsorption plate 200, ceramic materials having relatively less deformation than metallic materials may be favorable. Although it will be described later, the adsorption plate 200 is formed of porous ceramic materials, whereas the housing 100 may be made of dense ceramic materials.

The dense ceramic materials used to form the housing 100 may be prepared by, for example, sintering nitride ceramics, such as aluminum nitride, silicon nitride, boron nitride, or titanium nitride, carbide ceramics, such as silicon carbide, zirconium carbide, titanium carbide, tantalum carbide, or tungsten carbide, or oxide ceramics, such as alumina, zirconia, and/or kodurite, at a high temperature.

The adsorption plate 200 having a circular plate shape is seated in the accommodation part 120 that is an inside space of the housing 100. A top surface of the adsorption plate 200 may have a flat surface so that a wafer may be seated on and supported by the adsorption plate 200. A plurality of pores may be formed on a surface of the adsorption plate 200 and inside the adsorption plate 200. The plurality of pores may be connected to neighboring pores.

The adsorption plate 200 may be made of material including a plurality of pores. For example, the adsorption plate 200 may be made of porous ceramic materials. The adsorption plate 200 is a structure in which, when the wafer is placed on the adsorption plate 200 and air is suctioned from a lower portion of the vacuum chuck 10 through the vacuum line 111 and a vacuum pump (see, e.g., 20 of FIG. 9), a vacuum state is formed between the vacuum chuck 10 and the wafer such that the adsorption plate 200 and the wafer are attached to each other by means of a force due to the suction of the air. In other words, the wafer may not to be detached from the vacuum chuck 10 when in the vacuum state. The porous ceramic materials are made by, for example, sintering ceramic powder as a main raw material at a high temperature, and the shape of the porous ceramic materials is similar to a hard sponge. A difference between sizes of pores may occur according to a particle size of ceramic powder. When a pore size is too large, the wafer may be damaged, and when a pore size is too small, a vacuum adsorption rate may be lowered. Thus, an appropriate pore size may be adopted considering the size of the vacuum chuck 10 and the size of the wafer.

A thickness 200T of the adsorption plate 200 may be determined considering thermal conductivity or Youngs' modulus of materials used to form the vacuum chuck 10. When the thickness 200T of the adsorption plate 200 is too small, warpage may occur, and the strength of the adsorption plate 200 may be lowered such that the adsorption plate 200 may be damaged. In addition, when the thickness 200T of the adsorption plate 200 is too large, enlargement of the vacuum chuck 10 may occur.

The porous ceramic materials used to form the adsorption plate 200 may be prepared by sintering nitride ceramics, such as aluminum nitride, silicon nitride, boron nitride, or titanium nitride, carbide ceramics, such as silicon carbide, zirconium carbide, titanium carbide, tantalum carbide, or tungsten carbide, or oxide ceramics, such as alumina, zirconia, and/or kodurite, at a high temperature. In other words, the same materials as ceramic materials used to form the housing 100 may be used, but their densities may be different from each other.

When the adsorption plate 200 is seated on the accommodation part 120 of the housing 100, the vacuum opening 110 of the housing 100 is covered by a bottom surface of the adsorption plate 200, and the vacuum opening 110 forms a diffusion path of vacuum pressure supplied via the vacuum line 111. When the vacuum pressure is supplied to the vacuum line 111, the vacuum pressure is diffused along the circumference of the vacuum opening 110 of the housing 100. When the vacuum pressure is applied to the bottom surface of the adsorption plate 200 while being diffused in a radial direction of the housing 100, the vacuum pressure is diffused to the adsorption plate 200 via pores formed inside the adsorption plate 200 and is applied to a top surface of the adsorption plate 200. For example, the whole volume of the adsorption plate 200 may be applied with the vacuum pressure. When the vacuum pressure is applied to the top surface of the adsorption plate 200, the wafer is received onto the surface of the adsorption plate 200 due to the vacuum pressure and is fixed to the adsorption plate 200. To fully seat the adsorption plate 200 within the housing 100, the height of an uppermost surface of the adsorption plate 200 is the same as or lower than a height of an uppermost surface of the housing 100. For example, the uppermost surface of the adsorption plate 200 and the uppermost surface of the housing 100 may be coplanar.

By providing a uniform vacuum pressure on the entire top surface of the vacuum chuck 10 included in the semiconductor manufacturing apparatus (see, e.g., 1000 of FIG. 10) deviation or movement by a wafer on the vacuum chuck 10 may be prevented and warpage of a wafer during a semiconductor manufacturing process may be prevented.

However, when the adsorption plate 200 is located only in the center of the vacuum chuck 10, the vacuum pressure may be decreased away from the adsorption plate 200, e.g., toward the outside of the adsorption plate 200 in a radial direction of the vacuum chuck 10. Thus, no uniform vacuum pressure may be generated on the entire top surface of the vacuum chuck 10.

The plurality of adsorption grooves 131 may be formed in the outside region 130 of the housing 100 of the vacuum chuck 10 according to the present inventive concept. One end of each of the plurality of adsorption grooves 131 may extend to the accommodation part 120. For example, the plurality of adsorption grooves 131 extending to the accommodation part 120 may provide an opening along a side surface of the accommodation part 120. The other end of each of the plurality of adsorption grooves 131 may be placed in the radial direction not to be in contact with edges of the housing 100. For example, the accommodation part 120 and the plurality of adsorption grooves 131 may receive the vacuum pressure via the vacuum line 111 connected to the vacuum opening 110. Thus, a reduction in vacuum pressure toward the outside of the adsorption plate 200 in the radial direction of the vacuum chuck 10 may be prevented.

The vacuum chuck 10 according to the present inventive concept may be configured to support the wafer while the vacuum chuck 10 is in a fixed state without being rotated. In addition, the vacuum chuck 10 may be configured to support the wafer whiling rotating. To rotate the vacuum chuck 10, the vacuum chuck 10 may be a spin chuck configured to be rotated about a rotational axis 101. A detailed description thereof will be provided below.

Figure 3:
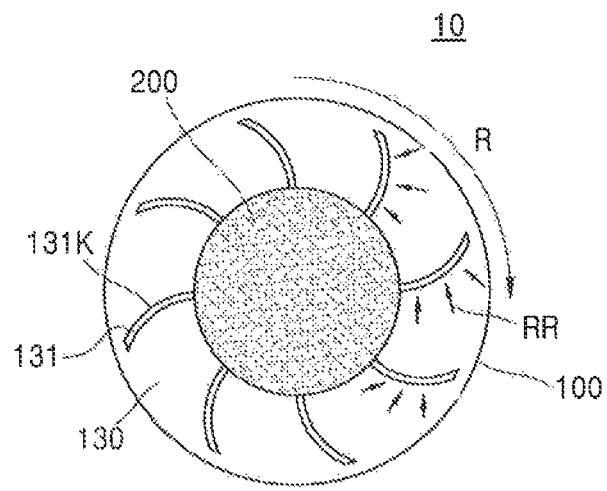
FIG. 3 is a plan view of the vacuum chuck according to an exemplary embodiment of the present inventive concept.
Figure 4:
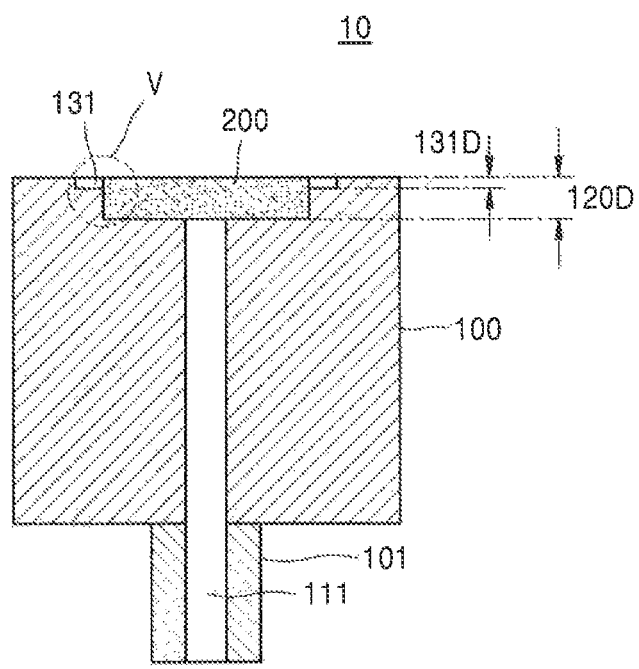
FIG. 4 is a cross-sectional view of the vacuum chuck according to an exemplary embodiment of the present inventive concept.
Figure 5:
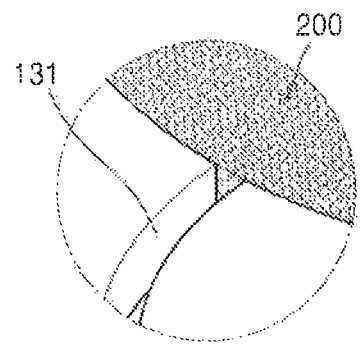
FIG. 5 is an enlarged perspective view of region V of FIG. 4 according to an exemplary embodiment of the present inventive concept.

FIG. 3 is a plan view of the vacuum chuck according to an exemplary embodiment of the present inventive concept, FIG. 4 is a cross-sectional view of the vacuum chuck according to an exemplary embodiment of the present inventive concept, and FIG. 5 is an enlarged perspective view of region V of FIG. 4 according to an exemplary embodiment of the present inventive concept.

Referring to FIGS. 3, 4, and 5, the plurality of adsorption grooves 131 having an arc shape formed in the outside region 130 of the housing 100 of the vacuum chuck 10 are illustrated in detail below. The plurality of adsorption grooves 131 may be formed in a top surface of the housing 100 to a predetermined depth 131D and may be formed in a radial direction in which the adsorption grooves 131 extend from the adsorption plate 200 to the outside of the adsorption plate 200 in the radial direction. For example, the adsorption grooves 131 may extend from the adsorption plate 200 to the outside region 130. The plurality of adsorption grooves 131 are spaced from one another in the radial direction about the adsorption plate 200 and are symmetrical to one another about the adsorption plate 200 so that balance of the vacuum chuck 10 may be maintained.

The adsorption plate 200 is seated on the accommodation part 120 that is an inside space of the housing 100. As described above, because the plurality of adsorption grooves 131 extend from the accommodation part 120 and are connected to each other, the adsorption plate 200 and the plurality of adsorption grooves 131 may be substantially in contact with each other and connected to each other.

When vacuum pressure is supplied to the vacuum line 111, the vacuum pressure is diffused along the circumference of the vacuum opening 110 of the housing 100. While the vacuum pressure is diffused in the radial direction of the housing 100 along the circumference of the vacuum opening 110, when the vacuum pressure is applied to the bottom surface of the adsorption plate 200, the vacuum pressure is diffused into the adsorption plate 200 via pores formed in the adsorption plate 200 and is applied to the top surface of the adsorption plate 200. In addition, the vacuum pressure is applied to the plurality of adsorption grooves 131 that are substantially in contact with sides of the adsorption plate 200 and connected thereto.

The top surface of the housing 100 includes the accommodation part 120 that is the inside space of the housing 100 and the outside region 130 that at least partially surrounds the accommodation part 120. However, the present inventive concept is not limited thereto, and for example, the outside region 130 may completely surround the accommodation part 120. The planar shape of the accommodation part 120 corresponds to the planar shape of the adsorption plate 200. The plurality of adsorption grooves 131 are formed in the outside region 130. In addition, when viewed from an upward direction, the adsorption plate 200 is formed in a center region of the top surface of the housing 100 and the plurality of adsorption grooves 131 are formed in the outside region 130, such that the adsorption plate 200 and the plurality of adsorption grooves 131 do not cross each other, so that the vacuum pressure may be diffused.

The depth 131D of each of the plurality of adsorption grooves 131 formed in the outside region 130 of the housing 100 may be approximately 180 μm to approximately 220 μm. In addition, the depth 131D of each of the plurality of adsorption grooves 131 may be less than a depth 120D of the accommodation part 120. In other words, the depth 131D of each of the plurality of adsorption grooves 131 may be less than the thickness 200T of the adsorption plate 200.

In the vacuum chuck 10 according to an exemplary embodiment of the present inventive concept, a method for providing a uniform vacuum pressure onto the entire top surface of the vacuum chuck 10 is that the plurality of adsorption grooves 131 that are in contact with the adsorption plate 200 and connected thereto are arranged in the outside region 130 at predetermined intervals.

In an exemplary embodiment of the present inventive concept, the plurality of adsorption grooves 131 may have the same curvature radius and may be formed in such a way that an inflection point 131K may be located at each of the plurality of adsorption grooves 131 while being a distance from the accommodation part 120. For example, the inflection point 131K of each adsorption groove 131 is substantially the same distance from the accommodation part 120. In addition, a rotation direction R of the vacuum chuck 10 and the arrangement direction of convex portions of the plurality of the adsorption grooves 131 may be the same. For example, the rotation direction R may be a clockwise or counter-clockwise direction. This is based on the result of simulation in which, due to resistance RR generated in an opposite direction to the rotation direction R of the vacuum chuck 10, the vacuum pressure provided into the plurality of adsorption grooves 131 may be substantially constantly maintained even during high-speed rotation of the vacuum chuck 10. The curvature of the plurality of adsorption grooves 131 and the location of the inflection point 131K may be changed according to the size of the wafer and the magnitude of a rotational force.

In the drawings, the number of adsorption grooves 131 is 8. However, the number of adsorption grooves 131 may be greater than or less than 8 according to the size of the wafer and the magnitude of the rotational force.

Stably providing a wafer on a vacuum chuck of a semiconductor manufacturing apparatus is a significant factor for determining efficiency of a manufacturing process and reliability of a semiconductor product. If the wafer is not stably seated on the vacuum chuck and the wafer is not properly positioned on the vacuum chuck, defects may occur such that reliability of the semiconductor product may be lowered and a manufacturing time may be delayed.

In the vacuum chuck 10 according to an exemplary embodiment of the present inventive concept, as the plurality of adsorption grooves 131 are formed in the outside region 130 of the housing 100, even when the vacuum pressure supplied from the adsorption plate 200 is decreased due to a long distance between the adsorption grooves 131 and the adsorption plate 200, the vacuum pressure supplied from the plurality of adsorption grooves 131 may complement the vacuum pressure from the adsorption plate 200 so that uniform vacuum pressure may be formed on the entire top surface of the vacuum chuck 10. Therefore, the wafer may be uniformly and stably fixed despite warpage of the wafer. A detailed description thereof will be provided below.

Figure 6:
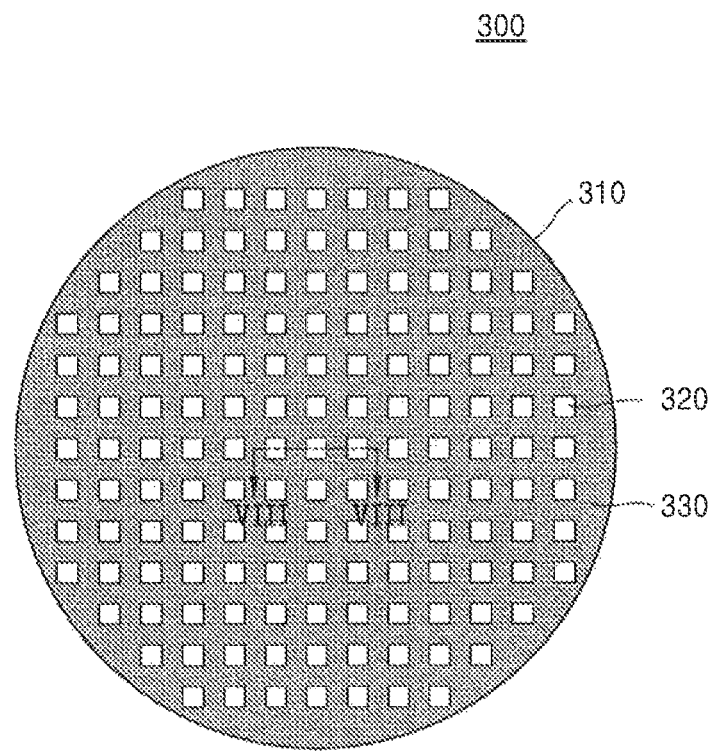
FIG. 6 is a schematic plan view of a wafer mounted on the vacuum chuck according to an exemplary embodiment of the present inventive concept.
Figure 7A:
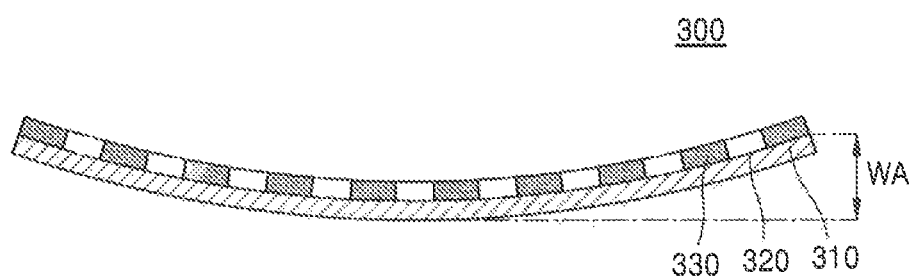
FIGS. 7A and 7B are schematic views of warpage of the wafer of FIG. 6 according to an exemplary embodiment of the present inventive concept.
Figure 7B:
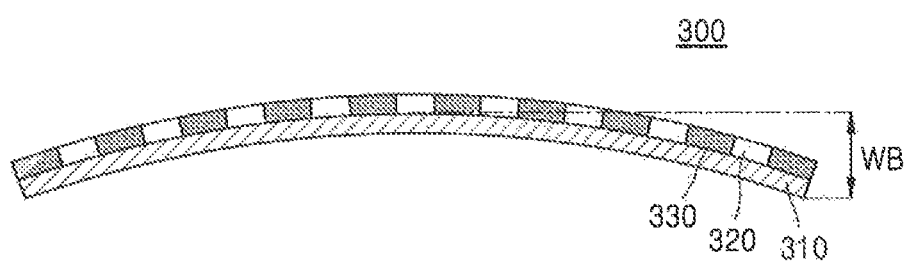

FIG. 6 is a schematic plan view of a wafer mounted on the vacuum chuck according to an exemplary embodiment of the present inventive concept, and FIGS. 7A and 7B are schematic views of warpage of the wafer of FIG. 6 according to an exemplary embodiment of the present inventive concept.

Referring to FIGS. 6, 7A and 7B, a wafer 300 includes a plurality of wafer-level semiconductor packages 320 mounted on a base substrate 310 and a molding member 330 that surrounds the plurality of wafer-level semiconductor packages 320.

The wafer 300 includes the plurality of wafer-level semiconductor packages 320 mounted on the base substrate 310 and the molding member 330 that covers a portion of a top surface of the base substrate 310 and sides of the plurality of wafer-level semiconductor packages 320. For example, the entire top surface of the base substrate 310 is covered by the plurality of wafer-level semiconductor packages 320 and the molding member 330.

In the wafer 300 having this structure, materials used to form the base substrate 310, the plurality of wafer-level semiconductor packages 320, and the molding member 330 are different from each other. Thus, the base substrate 310, the plurality of wafer-level semiconductor packages 320, and the molding member 330 may have different CTEs. Thus, when a temperature change occurs during the manufacture of the wafer 300, for example, in the wafer 300, the molding member 330 may be contracted or may expand in a room temperature and high temperature environment such that deformation, such as warpage of the wafer 300, may occur.

A case where the base substrate 310 and the molding member 330 that constitute the wafer 300 have different CTEs, for example, the case where the CTE of the molding member 330 is greater than the CTE of the base substrate 310, will be described below. At room temperature, the molding member 330 having a relatively large CTE is contracted and tensile stress is applied to the base substrate 310. For example, warpage occurs in the wafer 300 such that a center of the wafer 300 warps downwards, as illustrated in FIG. 7A. At a high temperature, the molding member 330 having a relatively large CTE expands, and compressive stress is applied to the base substrate 310. For example, warpage occurs in the wafer 300 such that the center of the wafer 300 warps upwards, as illustrated in FIG. 7B. In addition, due to warpage of the wafer 300, the base substrate 310 is not flat, and height differences WA and WB between the center and a peripheral portion of the base substrate 310 occur.

In addition, the case where the CTE of the molding member 330 is less than the CTE of the base substrate 310 will be described below. At room temperature, the molding member 330 having a relatively small CTE expands, and compressive stress is applied to the base substrate 310. For example, warpage occurs in the wafer 300 such that the center of the wafer 300 warps upwards, as illustrated in FIG. 7B. At a high temperature, the molding member 330 having a relatively small CTE is contracted, and tensile stress is applied to the base substrate 310. For example, warpage occurs in the wafer 300 such that the center of the wafer 300 warps downwards, as illustrated in FIG. 7A.

In this way, when the center of the wafer 300 is not flat due to warpage of the wafer 300, when the semiconductor manufacturing apparatus (see, e.g., 1000 of FIG. 10) adsorbs the wafer 300 using a vacuum chuck (see, e.g., 10 of FIG. 1), the wafer 300 may not be precisely mounted on the vacuum chuck, and the wafer 300 may not be fixed at a desired location such that work defects and process losses may occur during the semiconductor manufacturing process.

To reduce work defects and process losses during a semiconductor manufacturing process, a vacuum chuck (see, e.g., 10 of FIG. 1) according to the present inventive concept and a semiconductor manufacturing apparatus (see, e.g., 1000 of FIG. 10) having the same will be proposed.

Figure 8:
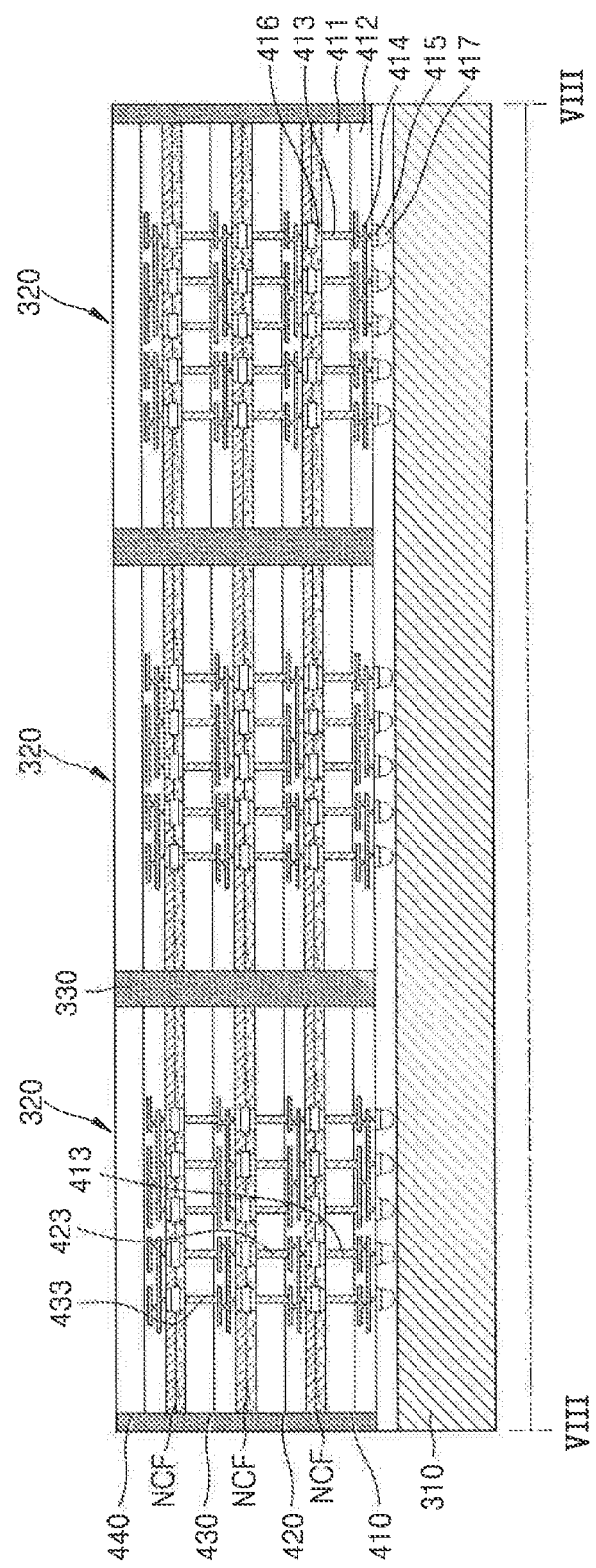
FIG. 8 is a cross-sectional view taken along a line VIII-VII of FIG. 6 according to an exemplary embodiment of the present inventive concept.

FIG. 8 is a cross-sectional view taken along a line VIII-VIII of FIG. 6 according to an exemplary embodiment of the present inventive concept.

Referring to FIG. 8, a wafer-level semiconductor package 320 may include first through fourth semiconductor chips 410, 420, 430, and 440, which are stacked in a vertical direction.

The first through fourth semiconductor chips 410, 420, 430, and 440 may be electrically connected to one another through first through third through silicon vias (TSVs) 413, 423, and 433 and may be physically connected to the base substrate 310. In addition, the first through fourth semiconductor chips 410, 420, 430, and 440 may be attached to one another using a non-conductive film (NCF).

The first through fourth semiconductor chips 410, 420, 430, and 440 may be logic chips or memory chips. For example, the first through fourth semiconductor chips 410, 420, 430, and 440 may be memory chips of the same types, or a portion of the first through fourth semiconductor chips 410, 420, 430, and 440 may be memory chips, and another portion thereof may be logic chips.

The memory chips may be, for example, volatile memory chips such as dynamic random access memory (DRAM) or static random access memory (SRAM), or non-volatile memory chips such as phase-change random access memory (PRAM), magnetoresistive random access memory (MRAM), ferroelectric random access memory (FeRAM) or resistive random access memory (RRAM). In an exemplary embodiment of the present inventive concept, the first through fourth semiconductor chips 410, 420, 430, and 440 may be high bandwidth memory (HBM). In addition, the logic chips may be, for example, microprocessors, analog devices, or digital signal processors.

The wafer-level semiconductor package 320, on which the first through fourth semiconductor chips 410, 420, 430, and 440 are stacked, is illustrated. However, the number of semiconductor chips stacked on the wafer-level semiconductor package 320 is not limited thereto. For example, at least two semiconductor chips may be stacked on the wafer-level semiconductor package 320.

The first semiconductor chip 410 may include a first semiconductor substrate 411, a first semiconductor device layer 412, the first TSV 413, a first wiring structure 414, a first lower connection pad 415, a first upper connection pad 416, and a first connection bump 417.

The first semiconductor substrate 411 may include top and bottom surfaces that are opposite to each other. The first semiconductor substrate 411 may include the first semiconductor device layer 412 formed on a bottom surface of the first semiconductor substrate 411. The first TSV 413 may pass through the first semiconductor substrate 411, may extend from the top surface of the first semiconductor substrate 411 to the bottom surface thereof, and may be connected to the first wiring structure 414 provided within the first semiconductor device layer 412. The first lower connection pad 415 may be formed on the first semiconductor device layer 412 and may be electrically connected to the first TSV 413 through the first wiring structure 414.

The first semiconductor substrate 411 may include silicon, for example. In addition, the first semiconductor substrate 411 may include a semiconductor element such as germanium, or a compound semiconductor, such as silicon carbide (SiC), gallium arsenide (GaAs), indium arsenide (InAs), or indium phosphide (InP). In addition, the first semiconductor substrate 411 may have a silicon on insulator (SOI) structure. For example, the first semiconductor substrate 411 may include a buried oxide (BOX) layer. The first semiconductor substrate 411 may include a conductive region, for example, a well doped with an impurity, or a structure doped with an impurity. In addition, the first semiconductor substrate 411 may have various isolation structures such as a shallow trench isolation (STI) structure.

The first semiconductor device layer 412 may be formed to include the first wiring structure 414 for connecting a plurality of individual elements to other wirings formed on the first semiconductor substrate 411. The first wiring structure 414 may include a metallic wiring layer and a via plug. For example, the first wiring structure 414 may have a multi-layer structure in which two or more metallic wiring layers and two or more via plugs are alternately stacked.

The first TSV 413 may extend from the top surface of the first semiconductor substrate 411 to the bottom surface thereof and may extend into the first semiconductor device layer 412. At least a portion of the first TSV 413 may have a pillar shape.

The first lower connection pad 415 may be placed on the first semiconductor device layer 412 and may be electrically connected to the first wiring structure 414 inside the first semiconductor device layer 412. The first lower connection pad 415 may be electrically connected to the first TSV 413 through the first wiring structure 414. The first lower connection pad 415 may include at least one among aluminum, copper, nickel, tungsten, platinum, and/or gold.

A lower passivation layer may be formed on the first semiconductor device layer 412 so as to protect the first wiring structure 414 within the first semiconductor device layer 412 and other structures at a lower portion of the first wiring structure 414. The lower passivation layer may expose at least a portion of a top surface of the first lower connection pad 415.

The first upper connection pad 416 may be formed on the top surface of the first semiconductor substrate 411 and may be electrically connected to the first TSV 413. The first upper connection pad 416 may include substantially the same materials as those of the first lower connection pad 415. The upper passivation layer may be formed to at least partially surround a portion of sides of the first TSV 413 on the top surface of the first semiconductor substrate 411.

The first connection bump 417 may be placed on the first lower connection pad 415. At least one among a control signal, a power supply signal, and a ground signal for operations of the first through fourth semiconductor chips 410, 420, 430, and 440 may be provided from the outside (e.g., an external device) through the first connection bump 417, or a data signal to be stored in the first through fourth semiconductor chips 410, 420, 430, and 440 may be provided from the outside, or data to be stored in the first through fourth semiconductor chips 410, 420, 430, and 440 may be provided from the outside. For example, the first connection bump 417 may have a pillar structure, a ball structure, or a solder layer.

The second semiconductor chip 420 may be mounted on the top surface of the first semiconductor chip 410. The second semiconductor chip 420 may be electrically connected to the first semiconductor chip 410 through the first TSV 413 of the first semiconductor chip 410. In addition, an NCF may be disposed between the top surface of the first semiconductor chip 410 and the bottom surface of the second semiconductor chip 420 so that the second semiconductor chip 420 may be attached onto the first semiconductor chip 410.

The third semiconductor chip 430 may be mounted on the top surface of the second semiconductor chip 420, and the fourth semiconductor chip 440 may be mounted on the top surface of the third semiconductor chip 430. An NCF may be disposed between the second semiconductor chip 420 and the third semiconductor chip 430. An NCF may be disposed between the third semiconductor chip 430 and the fourth semiconductor chip 440.

Because the second through fourth semiconductor chips 420, 430, and 440 may have the same or similar technical features as or to those of the first semiconductor chip 410, a detailed description of the second through fourth semiconductor chips 420, 430, and 440 may be omitted. However, the fourth semiconductor chip 440 may have no TSV, unlike in the first through third semiconductor chips 410, 420, and 430.

The molding member 330 may surround sides of the first through fourth semiconductor chips 410, 420, 430, and 440 and sides of the NCF. In an exemplary embodiment of the present inventive concept, the molding member 330 may expose a top surface of the fourth semiconductor chip 440 to the outside. In an exemplary embodiment of the present inventive concept, the molding member 330 may cover the top surface of the fourth semiconductor chip 440. The molding member 330 may include an epoxy mold compound (EMC), for example.

A semiconductor package used in an electronic device may provide, for example, high performance and large capacity storage and/or processing in addition to miniaturization and light weight. To realize, for example, high performance and large capacity storage and/or processing in addition to miniaturization and light weight, research and development of semiconductor chips having TSVs and a semiconductor package on which the semiconductor chips are stacked, have been continuously carried out.

In this case, the thickness of the molding member 330 may be increased to surround sides of the first through fourth semiconductor chips 410, 420, 430, and 440. As described above, as the thickness of the molding member 330 is increased, a probability that warpage of the wafer 300 may occur due to a CTE difference between the base substrate 310 and the molding member 330, may be further increased.

Thus, a vacuum chuck (see, e.g., 10 of FIG. 1) according to the present inventive concept, whereby the wafer 300 may be uniformly fixed despite warpage of the wafer 300, and a semiconductor manufacturing apparatus (see, e.g., 1000 of FIG. 10) having the same are proposed.

Figure 9:
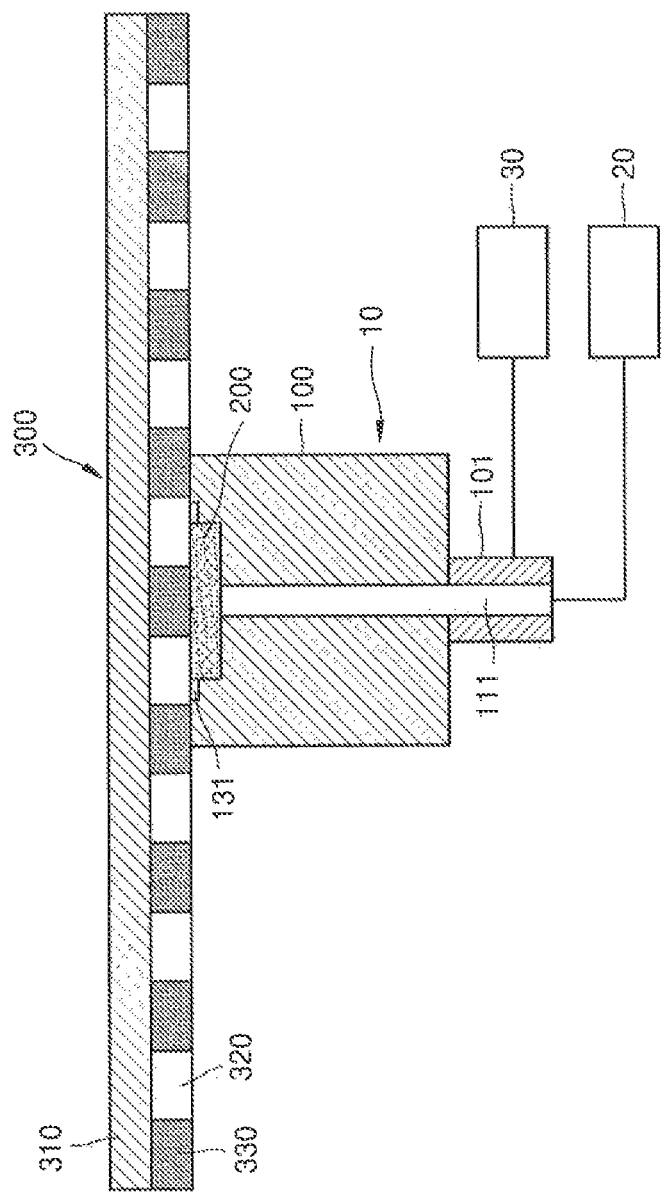
FIG. 9 is a cross-sectional view of a state where the wafer is mounted on the vacuum chuck according to an exemplary embodiment of the present inventive concept.

FIG. 9 is a cross-sectional view of a state where the wafer is mounted on the vacuum chuck according to an exemplary embodiment of the present inventive concept.

Referring to FIG. 9, the wafer 300 may be seated on the vacuum chuck 10 so that the plurality of wafer-level semiconductor packages 320 and the molding member 330 may be adsorbed onto the top surface of the vacuum chuck 10.

A portion of the vacuum chuck 10 that contacts the wafer 300 may be referred to as a top surface of the vacuum chuck 10. The vacuum chuck 10 may be lifted so that the wafer 300 may be in contact with the top surface of the vacuum chuck 10. The wafer 300 may be adsorbed to the vacuum chuck 10 and fixed thereto due to vacuum pressure provided by the vacuum pump 20 connected to the vacuum chuck 10. As described above, the vacuum line 111 for supplying the vacuum pressure may be formed in the housing 100. The vacuum pressure formed by a vacuum generating unit such as the vacuum pump 20 is provided to the vacuum line 111.

As an element for rotating the vacuum chuck 10, a rotational axis 101 may be coupled to a lower portion of the housing 100, and a power unit 30 for supplying a rotational force to the rotational axis 101 may be connected to the rotational axis 101. The rotational axis 101 is coupled to the center of the housing 100 and transmits the rotational force supplied from the power unit 30 to the housing 100. For example, when the rotational force is supplied to the housing 100, the rotational axis 101 will rotate the housing 100.

In an exemplary embodiment of the present inventive concept, when the vacuum chuck 10 is a spin chuck, the structure of the vacuum chuck 10 may be symmetrical with respect to the center of, for example, the housing 100 to prevent unnecessary vibration of the wafer 300 from occurring during rotation. In addition, even when the vacuum chuck 10 is not a spin chuck, the symmetrical structure of the adsorption plate 200 and the plurality of adsorption grooves 131 with respect to the center of the vacuum chuck 10 is favorable to adjust balance of the vacuum chuck 10.

Although, in the drawings, the wafer 300 seated on the top surface of the vacuum chuck 10 is flat, warpage may occur in the wafer 300 such that the wafer 300 may not be flat. Thus, the vacuum chuck 10 according to an exemplary embodiment of the present inventive concept, whereby the wafer 300 may be uniformly fixed despite warpage of the wafer 300, is proposed.

FIG. 10 is an internal plan view of a semiconductor manufacturing apparatus having a vacuum chuck according to an exemplary embodiment of the present inventive concept.

Referring to FIG. 10, a semiconductor manufacturing apparatus 1000 according to an exemplary embodiment of the present inventive concept may be a wafer marking apparatus for forming distinguishable marking patterns on a wafer. The marking patterns may be characters, numbers, other identification symbols, bar codes, or quick response (QR) codes.

The semiconductor manufacturing apparatus 1000 according to an exemplary embodiment of the present inventive concept is not limited to a wafer marking apparatus, and any semiconductor manufacturing apparatus having a vacuum chuck (see, e.g., 10 of FIG. 1) may be used as the semiconductor manufacturing apparatus 1000.

The semiconductor manufacturing apparatus 1000 includes a wafer supply unit 1100 for supplying a wafer to be marked, and a wafer carrying-out unit 1400 from which the marked wafer is carried out. The semiconductor manufacturing apparatus 1000 further includes a wafer marking unit 1300 including a wafer support holder 1320 having a plate into which the wafer to be marked is inserted and on which the wafer to be marked is supported, and a vacuum chuck 1330 for setting a location at which the wafer is seated on the wafer support holder 1320. The semiconductor manufacturing apparatus 1000 additionally includes a laser marking device 1340 for marking predetermined contents on the wafer seated on the wafer support holder 1320, and at least one wafer transfer robot 1500 that supplies the wafer to be marked to the wafer marking unit 1300 using the wafer supply unit 1100 and transfers the wafer marked by the wafer marking unit 1300 to the wafer carrying-out unit 1400.

The vacuum chuck 1330 may be a vacuum chuck (see, e.g., 10 of FIG. 1) according to an exemplary embodiment of the present inventive concept described above.

The wafer supply unit 1100 is a supply unit that supplies wafers to be marked, and the wafers being supplied are stacked such that they are spaced apart from each other. The wafer supplied by the wafer supply unit 1100 is pre-aligned by a preliminary alignment unit 1200 and then is transferred to the wafer marking unit 1300. Pre-alignment of the wafers performed by the preliminary alignment unit 1200 that is a process of matching round directivity according to the type of the wafers may be distinguished from an alignment test performed by the wafer marking unit 1300 according to their purposes. The wafer aligned by the preliminary alignment unit 1200 is transferred to the wafer marking unit 1300. The wafer marking unit 1300 includes the wafer support holder 1320 into which the wafer to be marked is inserted and on which the wafer to be marked is supported, and the laser marking device 1340 that marks a predetermined content onto the wafer seated on the wafer support holder 1320.

The wafer support holder 1320 is transferable in an axial direction predetermined by the horizontal transfer device 1310. The horizontal transfer device 1310 may displace a location of the wafer support holder 1320 on which the wafer is accommodated, from the inside of the wafer marking unit 1300 in a horizontal direction according to each process.

The wafer marking unit 1300 may further include an alignment test device 1350 having a camera to increase precision of marking. The alignment test device 1350 tests an alignment state of the wafer and captures an image of the alignment state and reads it so that marking may be performed at a correct location. The alignment test device 1350 may perform photographing for testing the alignment state.

A unit for transferring the wafer to be marked from the preliminary alignment unit 1200 to the wafer marking unit 1300 is the wafer transfer robot 1500, and a unit for transferring the wafer transferred to the wafer marking unit 1300 to the inside of the wafer marking unit 1300 is the horizontal transfer device 1310 including the wafer support holder 1320 on which the wafer is mounted.

The wafer marked by the wafer marking unit 1300 may be carried out by the wafer carrying-out unit 1400 using the wafer transfer robot 1500 such that the marking process may be terminated. The wafer transfer robot 1500 may have a plurality of joints to transfer the wafer in various directions. In other words, a transfer direction is not limited. The wafer supply unit 1100, the preliminary alignment unit 1200, the wafer marking unit 1300, and the wafer carrying-out unit 1400 are placed about the wafer transfer robot 1500 in all directions such that a robot arm including multi-joints may be implemented to extend in all directions As described above, when the center of the wafer is not flat due to warpage of the wafer, when the semiconductor manufacturing apparatus 1000 adsorbs the wafer using the vacuum chuck 1330, the wafer may not be precisely mounted on the vacuum chuck 1330 or may be deviated therefrom. When the wafer is not fixed at a desired position, work defects and process losses during the marking process may occur.

To remarkably reduce working defects and process losses during the semiconductor manufacturing process, the vacuum chuck (see, e.g., 10 of FIG. 1) according to an exemplary embodiment of the present inventive concept and the semiconductor manufacturing apparatus (see, e.g., 1000) having the same have been described.

While the present inventive concept has been shown and described with reference to the exemplary embodiments thereof, it will be apparent to those of ordinary skill in the art that various changes in form and detail may be made thereto without departing from the spirit and scope of the present inventive concept as defined by the following claims.

What is claimed is:

1. A vacuum chuck, comprising:
    an adsorption plate including porous materials;
    a housing including an accommodation part, a plurality of adsorption grooves, and a vacuum opening formed in the accommodation part, wherein the adsorption plate is disposed in the accommodation part, and the plurality of adsorption grooves each have an arc shape and is formed in a surface of the accommodation part; and
    a vacuum line configured to supply vacuum pressure to the vacuum opening, wherein the plurality of adsorption grooves are formed in an uppermost surface of the housing.

2. The vacuum chuck of claim 1, wherein a first end of each of the plurality of adsorption grooves is in contact with the accommodation part, and a second end of each of the plurality of adsorption grooves has a radial form and is not in contact with edges of the housing.

3. The vacuum chuck of claim 2, wherein the accommodation part and the plurality of adsorption grooves receive the vacuum pressure through the vacuum opening.

4. The vacuum chuck of claim 1, wherein a radius of the housing is about 1.5 to about 2 times a radius of the adsorption plate, and a difference between the radius of the housing and the radius of the adsorption plate is equal to or greater than 10 mm.

5. The vacuum chuck of claim 4, wherein a radius of a wafer is greater than the radius of the housing, and the vacuum pressure is applied only to a center of the wafer.

6. The vacuum chuck of claim 1, wherein a depth of the accommodation Tart is greater than a depth of the plurality of adsorption grooves, and a depth of the plurality of adsorption grooves is about 180 μm to about 220 μm.

7. The vacuum chuck of claim 1, wherein the plurality of adsorption grooves have a same curvature radius, and an inflection point is located at each of the plurality of adsorption grooves and is spaced apart from the accommodation part by a first distance.

8. The vacuum chuck of claim 7, wherein a rotation direction of a wafer and an arrangement direction of convex portions of the plurality of adsorption grooves are the same.

9. The vacuum chuck of claim 1, wherein a density of materials of the housing is higher than a density of materials of the adsorption, plate.

10. The vacuum chuck of claim 1, wherein a level of an uppermost surface of the adsorption plate is the same as or lower than a level of the uppermost surface of the housing.

* * * * *